United States Patent
Wu et al.

(10) Patent No.: US 7,879,782 B2
(45) Date of Patent: Feb. 1, 2011

(54) AQUEOUS CLEANING COMPOSITION AND METHOD FOR USING SAME

(75) Inventors: Aiping Wu, Macungie, PA (US); Roberto John Rovito, Quakertown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 980 days.

(21) Appl. No.: 11/249,207

(22) Filed: Oct. 13, 2005

(65) Prior Publication Data
US 2007/0087948 A1 Apr. 19, 2007

(51) Int. Cl.
*C11D 7/32* (2006.01)
(52) U.S. Cl. .................................. 510/175; 510/176
(58) Field of Classification Search ................. 510/175, 510/176
See application file for complete search history.

(56) References Cited

U.S. PATENT DOCUMENTS

| | | | |
|---|---|---|---|
| 5,334,332 A | 8/1994 | Lee | |
| 5,381,807 A | 1/1995 | Lee | |
| 5,419,779 A | 5/1995 | Ward | |
| 5,709,756 A | 1/1998 | Ward et al. | |
| 5,780,406 A * | 7/1998 | Honda et al. | 510/175 |
| 5,795,702 A | 8/1998 | Tanabe et al. | |
| 5,817,610 A | 10/1998 | Honda et al. | |
| 6,020,297 A | 2/2000 | Austin et al. | |
| 6,030,932 A * | 2/2000 | Leon et al. | 510/175 |
| 6,033,993 A * | 3/2000 | Love et al. | 438/745 |
| 6,121,217 A | 9/2000 | Lee | |
| 6,187,730 B1 | 2/2001 | Lee | |
| 6,245,155 B1 * | 6/2001 | Leon et al. | 134/3 |
| 6,291,142 B1 | 9/2001 | Tanabe et al. | |
| 6,313,039 B1 | 11/2001 | Small et al. | |
| 6,361,712 B1 | 3/2002 | Honda et al. | |
| 6,413,923 B2 | 7/2002 | Honda et al. | |
| 6,417,112 B1 | 7/2002 | Peyne et al. | |
| 6,432,209 B2 | 8/2002 | Sahbari | |
| 2002/0132745 A1 * | 9/2002 | Honda et al. | 510/175 |
| 2003/0164471 A1 | 9/2003 | Small et al. | |
| 2004/0147420 A1 | 7/2004 | Zhou et al. | |
| 2004/0234904 A1 * | 11/2004 | Rieker et al. | 430/329 |
| 2005/0048397 A1 | 3/2005 | Jo et al. | |
| 2005/0205835 A1 * | 9/2005 | Tamboli et al. | 252/79.1 |
| 2006/0172905 A1 * | 8/2006 | Rovito et al. | 510/175 |

FOREIGN PATENT DOCUMENTS

| | | |
|---|---|---|
| JP | 7-325404 A2 | 12/1995 |
| JP | 9-296200 A | 11/1997 |
| JP | 2001-501649 A | 2/2001 |
| JP | 2001-517863 A | 10/2001 |
| JP | 2003-107754 A2 | 4/2003 |
| JP | 2003-155586 A2 | 5/2003 |
| WO | 98/10050 A1 | 3/1998 |
| WO | 99/15345 A1 | 4/1999 |
| WO | 99/60083 A1 | 11/1999 |
| WO | 2004/107056 A1 | 12/2004 |
| WO | 2005/042658 A1 | 5/2005 |
| WO | 2005/085408 A1 | 9/2005 |

* cited by examiner

*Primary Examiner*—Gregory E Webb
(74) *Attorney, Agent, or Firm*—Rosaleen P. Morris-Oskanian; Anne B. Kiernan

(57) ABSTRACT

An aqueous-based composition and method comprising same for removing residues such as without limitation post-ashed and/or post-etched photoresist from a substrate is described herein. In one aspect, there is provided a composition for removing residues comprising: water; at least one selected from a hydroxylamine, a hydroxylamine salt compound, and mixtures thereof; and a corrosion inhibitor wherein the composition is substantially free of an added organic solvent and provided that the corrosion inhibitor does not contain a water soluble organic acid.

11 Claims, No Drawings

AQUEOUS CLEANING COMPOSITION AND METHOD FOR USING SAME

BACKGROUND OF THE INVENTION

Numerous steps are involved in the fabrication of microelectronic structures. Within the manufacturing scheme of fabricating integrated circuits selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE) is the process of choice for pattern transfer during via, metal line and trench formation. For instance, complex semiconductor devices such as advanced DRAMS and microprocessors, which require multiple layers of interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al/Cu, Cu, Ti, TiN, Ta, TaN, W, TiW, silicon or a silicide such as a silicide of tungsten, titanium or cobalt. The RIE process typically leaves a residue (of a complex mixture) that may include re-sputtered oxide material as well as possibly organic materials from photoresist and antireflective coating materials used to lithographically define the vias, metal lines and or trench structures.

Post RIE or other etch processing, plasma photoresist residue cleaning is typically conducted by ashing the patterned photoresist with a plasma containing a reactive agent typically activated reactive gas(es) such as, without limitation, an oxygen-containing gas for oxidative processes or a hydrogen containing gas for reductive processes. Like the RIE process, plasma etch or plasma ash cleaning leaves a combination of residues including organic materials (e.g., residual photoresist, antireflective materials, and the like) and plasma etch related byproducts such as oxides or halides of titanium, copper, or related metals depending upon the plasma etch chemistry and substrate being treated.

It would therefore be desirable to provide a selective cleaning composition and process capable of removing residues such as, for example, residues resulting from selective etching using plasmas and/or RIE and oxidative ash or reductive ashing processes. Moreover, it would be desirable to provide a selective cleaning composition and process, capable of removing residues such as etching and ashing residue, that exhibits high selectivity for the residue as compared to metals, high dielectric constant ("high k") materials (e.g., materials having a dielectric constant greater than 4.1), silicon, silicide and/or interlevel dielectric materials including low dielectric constant ("low k") materials (e.g., materials having a dielectric constant less than 4.0 or less than 3.5 or less than 3.0) such as deposited oxides that might also be exposed to the cleaning composition. It would be desirable to provide a composition that is compatible with and can be used with such sensitive low k or porous low k films such as, but not limited to, hydrogen silsequioxane (HSQ), methylsilsequioxane (MSQ), FOx, BLACK DIAMOND™ films manufactured by Applied Materials, Inc., and TEOS (tetraethylorthosilicate). In addition to the above, it would be desirable for a composition that is aqueous-based so that the disposal thereof will not harm the environment.

BRIEF SUMMARY OF THE INVENTION

The aqueous-based composition disclosed herein is capable of selectively removing residue such as, without limitation, post plasma etch, post ash, or other residue from a substrate without attacking to any undesired extent metal, low k, porous low k, and/or high k dielectric materials that might also be exposed to the composition. In addition, the composition disclosed herein may exhibit minimal etch rates of certain dielectric materials such as silicon oxide or metal lines or interlayers including copper. The cleaning compositions described herein are substantially free of an added organic solvent which allows the semiconductor manufacture to reduce organic waste and the cost of ownership. In one aspect, there is provided a composition for removing residues from a substrate comprising: water; at least one selected from a hydroxylamine, a hydroxylamine salt compound, and mixtures thereof; and a corrosion inhibitor provided that the corrosion inhibitor does not comprise a water soluble organic acid and wherein the composition is substantially free of an added organic solvent.

Also disclosed herein is a method for removing residues including etching and/or ashing residue from a substrate that comprises contacting the substrate with the cleaning composition disclosed herein. In one aspect described herein, there is provided a method for defining a pattern comprising: coating a photoresist onto at least a portion of the substrate; lithographically defining a pattern on the photoresist; transferring the pattern onto at least a portion of the substrate; etching the pattern into the substrate to form a patterned substrate; exposing the patterned substrate to an activated reactive gas to remove at least a portion of the photoresist and provide a residue; and removing the residue by contacting the patterned substrate with a composition comprising: water; at least one selected from a hydroxylamine, a hydroxylamine salt compound, and mixtures thereof; and a corrosion inhibitor provided that the corrosion inhibitor does not comprise a water soluble organic acid and wherein the composition is substantially free of an added organic solvent.

In another aspect, there is provide a method for removing residues from a substrate comprising: contacting the substrate with a composition comprising: water; at least one selected from a hydroxylamine, a hydroxylamine salt compound, and mixtures thereof; and a corrosion inhibitor provided that the corrosion inhibitor does not comprise a water soluble organic acid and wherein the composition is substantially free of an added organic solvent.

DETAILED DESCRIPTION OF THE INVENTION

An aqueous-based composition and method comprising same for selectively removing residues such as, for example, processing residues such as the residues generated by etching such as, without limitation, reactive ion etching, plasma etching, and plasma ashing. The cleaning compositions disclosed are aqueous based and are substantially free, i.e., have 1% or less or 0.5% or less or 0.1% or less of an added organic solvent. The cleaning compositions are useful for removing photoresist, etching, ashing, or other processing residues from a substrate without corroding the underlying metal, dielectric, or both layers and while reducing the cost of ownership by eliminating the need for an added organic solvent.

The cleaning compositions comprise water, a hydroxylamine or a hydroxylamine salt compound, and a corrosion inhibitor provided that the corrosion inhibitor does not comprise a water soluble organic acid. In certain embodiments, the cleaning composition consists essentially of water, a hydroxylamine or a hydroxylamine salt compound, a corrosion inhibitor provided that the corrosion inhibitor does not comprise a water soluble organic acid, and other components provided that these components do not adversely effect the stripping and cleaning performance of the composition nor damage the underlying substrate surface. In still other embodiments, the cleaning composition consists of water, a hydroxylamine or a hydroxylamine salt compound, a corrosion inhibitor provided that the corrosion inhibitor does not comprise a water soluble organic acid.

In general, aqueous solutions containing hydroxylamine, hydroxylamine salt compounds, or both are not considered compatible with interconnect metals, such as copper which is commonly used in the manufacture of integrated circuits. It is surprising and unexpected that the cleaning compositions disclosed herein can remove post plasma etch and ash residues from substrates, including without limitation Cu and low k dielectrics. Further, for those embodiments wherein the substrate comprises copper, the cleaning compositions have unanticipated results on reducing Cu corrosion by the addition of a corrosion inhibitor.

In a cleaning method involving substrates useful for microelectronic devices, typical residues to be removed may include, for example, organic compounds such as etched and/or ashed photoresist material, ashed photoresist residue, UV- or X-ray-hardened photoresist, C-F-containing polymers, low and high molecular weight polymers, and other organic etch residues; inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching, plasma etching, and/or plasma ashing.

The residues are typically present in a substrate that also includes metal, silicon, silicate and/or interlevel dielectric materials such as, for example, deposited silicon oxides and derivatized silicon oxides such as HSQ, MSQ, FOX, TEOS and spin-on glass, chemical vapor deposited dielectric materials, and/or high k materials such as hafnium silicate, hafnium oxide, barium strontium titanate (BST), $TiO_2$, $TaO_5$, wherein both the residues and the metal, silicon, silicide, interlevel dielectric materials, low k and/or high k materials will come in contact with the cleaning composition. The composition and method disclosed herein provide for selectively removing the post-etched and/or post -ashed residues such as photoresist, BARC, gap fill, and/or processing residues without significantly attacking the metal, silicon, silicon dioxide, interlevel dielectric materials, low k and/or high k materials. In certain embodiments, the substrate may contain a metal, such as, but not limited to, copper, copper alloy, titanium, titanium nitride, tantalum, tantalum nitride, tungsten, and/or titanium/tungsten alloys. In one embodiment, the composition disclosed herein may be suitable for substrates containing sensitive low k films.

The composition disclosed herein may contain from about 40 to about 99% by weight or from about 75 to about 95% by weight or from about 90 to about 95% by weight of water. It can be present incidentally as a component of other elements, such as for example, an aqueous solution comprising the hydroxylamine or it can be added separately. Some non-limiting examples of water include deionized water, ultra pure water, distilled water, doubly distilled water, or deionized water having a low metal content.

The composition disclosed herein may contain from about 1 to about 30% by weight or from about 5 to about 20% by weight or from about 5 to about 15% by weight of at least one selected from a hydroxylamine, a hydroxylamine salt compound, and mixtures thereof. Examples of hydroxylamines that may be used in the cleaning composition described herein include hydroxylamine or alkyl-substituted derivates of hydroxylamine such as without limitation diethyl hydroxylamine. Hydroxylamine salt compounds are typically produced by reacting hydroxylamine with an acid such as, without limitation, nitric acid, sulfuric acid, hydrochloric acid, phosphoric acid or other acids. Examples of hydroxylamine salt compounds include hydroxylammonium sulfate, hydroxylammonium nitrate, hydroxylammonium phosphate, hydroxylammonium chloride, hydroxylammonium oxalate, hydroxylammonium citrate, and the like. Further examples of hydroxylamine salt compounds include alkyl-substituted derivatives such as, but not limited to, diethyl hydroxylammonium salt and the like.

The composition disclosed herein also contains from about 0.1 to about 15% by weight or from about 0.2 to about 10% or from about 0.5 to about 5% by weight of a corrosion inhibitor provided that the corrosion inhibitor used herein does not contain a water soluble organic acid. The term "water soluble organic acid" describes compounds containing a "COOH" or carboxyl group. Any corrosion inhibitor known in the art for similar applications, such as those disclosed in U.S. Pat. No. 5,417,877 which is incorporated herein by reference may be used. Corrosion inhibitors may be, for example, a phenol or a triazole. Examples of particular corrosion inhibitors include maleic anhydride, phthalic anhydride, benzotriazole (BZT), resorcinol, carboxybenzotriazole, diethyl hydroxylamine and the lactic acid and citric acid salts thereof, and the like. Further examples of corrosion inhibitors that may be used include catechol, pyrogallol, and esters of gallic acid. Yet other examples of suitable corrosion inhibitors include fructose, ammonium thiosulfate and tetramethylguanidine. In certain embodiments, the corrosion inhibitors are mercapto-group containing compounds such as, but not limited to, 2-mercapto-5-methylbenzimidazole and 2-mercaptothiazoline. Still other examples of corrosion inhibitors include mercapto-group containing compounds which have a hydroxyl group on one side of the α- or β-position of the compound. Specific examples of these compounds include 3-mercapto-1,2-propanediol (which is also referred to as thioglycerol), 3-(2-aminophenylthio)-2-hydroxymercaptan, 3-(2-hydroxyethylthio)-2-hydroxypropylmercaptan, and mixtures thereof.

In certain embodiments, the composition disclosed herein may further comprise one or more additional components or additives provided that these additives do not adversely affect the stripping and cleaning performance of the composition nor damage the underlying substrate surface. Examples of these additives include, without limitation, surfactants, chelating agents, chemical modifiers, dyes, biocides, and/or other additives in amounts up to a total of about 5% by weight % based on the total weight of the composition.

In embodiments wherein the compositions include hydroxylamine only (i.e., does not include the hydroxylamine salt compound), the compositions disclosed herein may have a pH that ranges from about 8 to about 12 or from about 8 to about 10. In embodiments wherein the compositions include a hydroxylamine salt compound only (i.e., does not include the hydroxylamine), the compositions disclosed herein may have a pH that ranges from about 3 to about 7 or from about 3 to about 5.

The compositions disclosed herein are compatible with low k films such as, without limitation HSQ, FOx, MSQ, and SiLK™ (which is manufactured by Dow Chemical, Inc.), and other films. The formulations are also effective in stripping post-etched and/or post-ashed photoresists and plasma etch residues such as organic residues, organometallic residues, inorganic residues, metallic oxides, or photoresist complexes at low temperatures with relatively low corrosion of the underlying substrate such as, for example, those substrates containing copper, titanium, or both. Moreover, the compositions are compatible with a variety of low k, porous low k, and high k materials.

During the manufacturing process, a photoresist layer is coated on the substrate. Using photolithographic process, a pattern is defined on the photoresist layer. In certain embodiments, the patterned photoresist layer is subjected to plasma etch such as RIE by which the pattern is transferred to the substrate. The patterned photoresist layer is then removed by wet chemical means and/or dry removal processes (e.g., plasma etch, plasma ash, or both). In embodiments where RIE is used to transfer the pattern onto the substrate, the etch residues are generated prior to wet chemical and/or dry removal processes. If the substrates are not ashed, then the main residues to be cleaned are both etch residues and photoresist residues. In embodiments where the substrates are ashed, the main residues to be cleaned are ashed residues such as ashed photoresists and etch residues if an etch step is conducted.

The method described herein may be conducted by contacting a substrate having a metal, organic or metal-organic polymer, inorganic salt, oxide, hydroxide, or complex or combination thereof present as a film or residue, with the described composition. The actual conditions, e.g., temperature, time, etc. depend on the nature and the thickness of the residues to be removed. In general, the substrate is contacted or dipped into a vessel containing the composition at a temperature ranging from 20° C. to 85° C., or from 20° C. to 60° C., or from 30° C. and 50° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein. However, the composition can be used in any method known in the art that utilizes a cleaning fluid for the removal of post-etched and/or ashed photoresist, ash or etch residues and/or other processing residues.

EXAMPLES

The following examples are provided to further illustrate the composition and method described herein. Examples of the various exemplary compositions along with comparative examples and pH levels for each composition if available are set forth in Table I. In Table I, all amounts are given in weight percent and add up to 100 weight percent. The compositions disclosed herein were prepared by mixing the components together in a vessel at room temperature until all solids have dissolved. In the examples below, pH determinations were made using 5% aqueous solutions at ambient temperature. The substrates were coated with a positive resist that was developed, etched and ashed prior to exposure to the composition. In the following tables, "N.T." indicates not tested.

Table II illustrates the effectiveness of various exemplary compositions for removing residues from silicon wafer test substrates. The wafers had a low k, silicon oxide-containing film such as an organosilicate glass (OSG) film or JSR LKD-5109™ porous MSQ films provided by JSR, Inc., a titanium nitride barrier layer, a copper metallization layer, a BARC layer, and a photoresist pattern which was etched and ashed using a plasma etching and ashing process. The substrates were then processed by immersing the substrate in a variety of exemplary compositions. In this procedure, one or more test wafers were placed in a 600 milliliter (ml) beaker that contained 400 mls of each exemplary composition. The 600 ml beaker further included a 1 inch stir bar that rotated at 400 revolutions per minute. The exemplary compositions having the wafer(s) contained therein were then heated at the time and temperature provided in Table II. After exposure to the exemplary composition, the wafer(s) were rinsed with deionized water and dried with nitrogen gas. The wafers were cleaved to provide an edge and then examined using scanning electron microscopy (SEM) on a variety of pre-determined locations on the wafer and the results of the cleaning performance and damage to the underlying interlayer dielectric (ILD) were visually interpreted and coded as provided in Table II in following manner: for cleaning "+++" indicates excellent, "++" indicates good; "+" indicates fair; and "−" indicates poor and for ILD damage "++" indicates no damage, "+" indicates little damage, and "−" indicates severe damage.

The summary of etch rates on blanket silicon wafers containing copper or densified, doped tetraethylorthosilicate (TEOS) are provided in Table III. In all of the following etch rates, measurements were conducted at 5, 10, 20, 40, and 60 minutes of exposure at temperature intervals of 25° C., 50° C., and 65° C. Thickness measurements were determined at each time interval and graphed using a "least squares fit" model on the results for each exemplary composition. The calculated slope of the "least squares fit" model of each composition is the resultant etch rate provided in angstroms/minute (Å/min). In determining either the copper etch rate or TEOS etch rate, the wafers had a blanker layer of a known thickness deposited upon it. For Cu etch rate, the initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured and if necessary the procedure was repeated on the test wafer. For TEOS etch rate, the initial thickness was determined using a FilmTek 2000 SE Spectroscopic Ellipsometer/Reflectomer. Approximately 200 mls of a test solution was placed in a 250 ml beaker with stirring and heated, if required, to the specified temperature. If only one wafer was placed in a beaker containing solution a dummy wafer was placed in the beaker. After five minutes, each test wafer was washed with deionized water for three minutes and dried under nitrogen. The substrates were then baked at a temperature of 110° C. for approximately 10 minutes. Measurements of each wafer were taken and if necessary the procedure was repeated.

The oxide and low k dielectric etch rates provided in Table IV were obtained from various silicon wafer substrates having a layer of undoped and densified tetraethoxysilicate (TEOS), fluorosilicate glass (FSG), CORAL™ film manufactured by Novellus, Inc., thermal oxide (Tox) which is a generic oxide film purchased from WaferNet, Inc., BLACK DIAMOND™ film manufactured by Applied Material, and JSR LEB-043™ which is a porous methylsilsequioxane (MSQ) film manufactured by JSR of a known thickness. All etch rates were determined using a FilmTek 2000 SE Spectroscopic Ellipsometer/Reflectomer and the same processes were used as for the undensified, doped tetraethylorthosilicate (TEOS) mentioned above. With the exception of the substrates having a Tox film, the substrates were then baked at a temperature of 110° C. for approximately 10 minutes. Measurements of each wafer were taken and if necessary the procedure was repeated.

TABLE I

Compositions

| EXAMPLE | Deionized Water | Hydroxylamine or Hydroxylamine Salt Compound | Corrosion Inhibitor | pH |
|---|---|---|---|---|
| Example 1 | 84 | Hydroxylamine (15) | Thioglycerol (1) | 9.02 |
| Example 2 | 83 | Hydroxylamine (15) | Thioglycerol (2) | 8.97 |
| Example 3 | 91.5 | Hydroxylammonium Sulfate (7.5) | Thioglycerol (1) | 3.85 |
| Example 4 | 91.5 | Hydroxylammonium chloride (7.5) | Thioglycerol (1) | 3.68 |
| Comparative Example 1 | 96.25 | Hydroxylamine (3.75) | None | 8.46 |
| Comparative Example 2 | 92.5 | Hydroxylamine (7.5) | None | N.T. |
| Comparative Example 3 | 85 | Hydroxylamine (15) | None | N.T. |
| Comparative Example 4 | 92.5 | Hydroxylammonium Sulfate (7.5) | None | 4 |
| Comparative Example 5 | 92.5 | Hydroxylammonium Chloride (7.5) | None | 3.88 |
| Comparative Example 6 | 85 | Hydroxylammonium Chloride (15) | None | N.T. |
| Comparative Example 7 | 70 | Hydroxylammonium Chloride (30) | None | N.T. |

TABLE III

Etch Rates

| EXAMPLE | Cu | | | TEOS (dense, p-dope) | | |
|---|---|---|---|---|---|---|
| | 25° C. | 50° C. | 65° C. | 25° C. | 50° C. | 65° C. |
| Ex. 1 | 2 | 3 | 5 | N.T. | 1 | 8 |
| Ex. 2 | 1.6 | 4 | 5 | N.T. | 1 | 8 |
| Ex. 3 | 1.6 | 1.4 | 5 | N.T. | N.T. | <1 |
| Ex. 4 | 2.5 | 2.6 | 9 | N.T. | N.T. | <1 |
| Comparative Ex. 1 | 23 | 20 | 28 | <1 | N.T. | N.T. |
| Comparative Ex. 2 | 40 | 102 | 128 | N.T. | N.T. | N.T |
| Comparative Ex. 3 | 101 | >207 | 342 | N.T. | N.T. | N.T |
| Comparative Ex. 4 | 192 | >224 | >225 | <1 | N.T. | N.T |
| Comparative Ex. 5 | 8 | 160 | >220 | <1 | N.T. | N.T |
| Comparative Ex. 6 | 14 | 27 | 42 | N.T. | N.T. | N.T |
| Comparative Ex. 7 | 12 | 24 | 42 | N.T. | N.T. | N.T |

TABLE II

SEM Results for Cleaning and ILD Damage

| | Temp. (° C.) | Time (min.) | Cu/OSG Clean | Cu/OSG ILD damage | Cu/JSR LKD-5109 ™ Clean | Cu/JSR LKD-5109 ™ ILD damage | Cu/pJSR LKD-5109 ™ Clean | Cu/pJSR LKD-5109 ™ ILD damage |
|---|---|---|---|---|---|---|---|---|
| Ex. 1 | 50 | 5 | N.T. | N.T. | +++ | ++ | +++ | ++ |
| | | 15 | ++ | ++ | +++ | ++ | +++ | + |
| | | 30 | +++ | ++ | +++ | ++ | ++ | — |
| Ex. 2 | 50 | 2 | N.T. | N.T. | +++ | ++ | — | ++ |
| | | 5 | +++ | ++ | +++ | ++ | N.T. | N.T. |
| | | 15 | +++ | ++ | +++ | ++ | +++ | ++ |
| | | 30 | N.T. | N.T. | N.T. | N.T. | +++ | + |
| Ex. 3 | 50 | 15 | + | ++ | — | ++ | — | ++ |
| | | 30 | + | ++ | — | ++ | +++ | ++ |
| Ex. 4 | 50 | 15 | — | ++ | — | ++ | — | ++ |
| | | 30 | — | ++ | — | ++ | — | ++ |

TABLE IV

Oxide Etch Rates

| | T (° C.) | TEOS (undoped, densified) | FSG (10 KÅ on 8–12 ohm silicon) | CORAL ™ (5 KÅ on low resistant silicon) | Tox (1 KÅ on 8–12 ohm silicon) | BLACK DIAMOND ™ | JSR LEB-043 ™ (5 KÅ on low resistant silicon) |
|---|---|---|---|---|---|---|---|
| | | | | Etch rate A/min | | | |
| Ex. 1 | 50 | <1 | <1 | <1 | <1 | <1 | <1 |
| Ex. 2 | 50 | N.T. | N.T. | N.T. | N.T. | N.T. | <1 |

The invention claimed is:

1. A composition for removing residue from a substrate comprising:
   water;
   a hydroxylamine salt compound; and
   from 0.1 to 15% by weight of a corrosion inhibitor provided that the corrosion inhibitor does not comprise a water soluble organic acid and further wherein the corrosion inhibitor comprises at least one selected from maleic anhydride, phthalic anhydride, benzotriazole, carboxybenzotriazole, diethyl hydroxvlamine, triazole, ammonium thiosulfate, tetramethvlauanidine, esters of gallic acid, 2-mercapto-5-methylbenzimidazole, 3-mercapto-1,2-propanediol, 2-mercaptothiazoline, 3-(2-aminophenvlthio)-2-hydroxymercaptan, 3-(2-hydroxvethylthio)-2-hydroxvpropylmercaptan, and mixtures thereof; and
   wherein the composition is substantially free of an added organic solvent and wherein the pH of the composition ranges from about 3 to 7.

2. The composition of claim 1 wherein the hydroxylamine salt compound is one selected from the group consisting of hydroxylammonium sulfate, hydroxylammonium nitrate, hydroxylammonium phosphate, hydroxylammonium chloride, hydroxylammonium oxalate, hydroxylammonium citrate, alkyl-substituted derivates of the hydroxylamine salt compound, and mixtures thereof.

3. A composition for removing residue from a substrate comprising:
   from 40 to 99% by weight of water;
   at least one selected from a hydroxylamine, a hydroxylamine salt compound, and mixtures thereof; and
   a corrosion inhibitor provided that the corrosion inhibitor does not comprise a water soluble organic acid,
   wherein the composition is substantially free of an added organic solvent, and
   wherein the composition has a pH ranging from about 8 to about 12.

4. The composition of claim 3 comprising the hydroxylamine and wherein the hydroxylamine is at least one selected from hydroxylamine, an alkyl-substituted derivative of the hydroxylamine, and mixtures thereof.

5. The composition of claim 1 wherein the corrosion inhibitor comprises 3-mercapto-1,2-propanediol (thioglycerol).

6. The composition of claim 3 wherein the corrosion inhibitor comprises 3-mercapto-1,2-propanediol (thioglycerol).

7. A composition for removing residues from a substrate comprising:
   from 40 to 99% by weight of water;
   from 1 to 30% by weight of at least one selected from a hydroxylamine, a hydroxylamine salt compound, and mixtures thereof;
   and from 0.1 to 15% by weight of a corrosion inhibitor provided that the corrosion inhibitor does not comprise a water soluble organic acid and wherein the composition is substantially free of an added organic solvent, and further wherein the corrosion inhibitor comprises at least one selected from maleic anhydride, phthalic anhydride, benzotriazole, carboxybenzotriazole, diethyl hydroxylamine, triazole, ammonium thiosulfate, tetramethylauanidine, esters of gallic acid, 2-mercapto-5-methylbenzimidazole, 3-mercapto-1,2-propanediol, 2-mercaptothiazoline, 3-(2-aminophenylthio)-2-hydroxymercaptan, 3-(2-hydroxyethylthio)-2-hydroxvpropylmercaptan, and mixtures thereof.

8. The composition of claim 7 wherein the corrosion inhibitor comprises 3-mercapto-1,2-propanediol (thioglycerol).

9. The composition of claim 1 wherein said composition comprises from about 75 to about 95% by weight said water; from about 5 to about 15% by weight said hydroxylamine salt and from about 0.5 to about 5% by weight said corrosion inhibitor.

10. The composition of claim 3 wherein said composition comprises from about 75 to about 95% by weight said water; from about 5 to about 15% by weight said at least one selected from a hydroxylamine, a hydroxylamine salt compound, and mixtures thereof; and from about 0.5 to about 5% by weight said corrosion inhibitor.

11. The composition of claim 7 wherein said composition comprises from about 75 to about 95% by weight said water; from about 5 to about 15% by weight said at least one selected from a hydroxylamine, a hydroxylamine salt compound, and mixtures thereof; and from about 0.5 to about 5% by weight said corrosion inhibitor.

* * * * *

UNITED STATES PATENT AND TRADEMARK OFFICE
CERTIFICATE OF CORRECTION

PATENT NO. : 7,879,782 B2  Page 1 of 1
APPLICATION NO. : 11/249207
DATED : February 1, 2011
INVENTOR(S) : Aiping Wu and Roberto John Rovito It is certified that error appears in the above-identified patent and that said Letters Patent is hereby corrected as shown below:

Column 9, Line 27

In claim 1, delete "hydroxvlamine" and insert -- hydroxylamine --

Column 9, Line 28

In claim 1, delete "tetramethvlauanidine" and insert -- tetramethylguanidine --

Column 9, Line 31

In claim 1, delete "nophenvlthio" and insert -- nophenylthio --

Column 9, Line 31

In claim 1, delete "(2-hydroxveth-" and insert -- -(2-hydroxyeth- --

Column 19, Line 32

In claim 1, delete "ylthio)-2hydroxvpropylmercaptan," and insert
-- ylthio)-2-hydroxypropylmercaptan, --

Column 10, Line 34

In claim 7, delete "ramethylauanidine," and insert -- ramethylguanidine, --

Column 10, Line 38

In claim 7, delete "vpropylmercaptan," and insert -- ypropylmercaptan, --

Signed and Sealed this
Twenty-first Day of June, 2011

David J. Kappos
*Director of the United States Patent and Trademark Office*